(12) United States Patent
Wang

(10) Patent No.: US 8,345,117 B2
(45) Date of Patent: Jan. 1, 2013

(54) TERMINAL OUTPUTTING MONOCHROME IMAGE DATA AND COLOR IMAGE DATA

(75) Inventor: Ynjiun P. Wang, Cupertino, CA (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 2 days.

(21) Appl. No.: 12/827,619

(22) Filed: Jun. 30, 2010

(65) Prior Publication Data

US 2012/0002066 A1    Jan. 5, 2012

(51) Int. Cl.
*H04N 5/228* (2006.01)
(52) U.S. Cl. ..................... 348/222.1; 348/272
(58) Field of Classification Search ............... 348/222.1, 348/272–280, 294, 302, 308
See application file for complete search history.

(56) References Cited

U.S. PATENT DOCUMENTS

| 6,999,119 | B1* | 2/2006 | Shibazaki et al. | 348/273 |
| 7,740,176 | B2 | 6/2010 | Wang et al. | |
| 7,784,696 | B2 | 8/2010 | Wang | |
| 7,978,240 | B2* | 7/2011 | Kido et al. | 348/276 |
| 7,984,855 | B2 | 7/2011 | Wang | |
| 8,025,232 | B2 | 9/2011 | Wang | |
| 2006/0283952 | A1* | 12/2006 | Wang | 235/462.01 |
| 2007/0284448 | A1 | 12/2007 | Wang | |
| 2010/0231770 | A1* | 9/2010 | Honda et al. | 348/308 |

FOREIGN PATENT DOCUMENTS

WO    2006098954 A2    9/2006

OTHER PUBLICATIONS

U.S. Appl. No. 13/245,490, titled Indicia Reading Apparatus Having Image Sensing Integrated Circuit, filed Sep. 26, 2011.
Dec. 22, 2011 Search Report in related European Application No. 11171200.6.

* cited by examiner

*Primary Examiner* — Gevell Selby
(74) *Attorney, Agent, or Firm* — Heslin Rothenberg Farley & Mesiti, PC

(57) ABSTRACT

There is provided an imaging terminal comprising an image sensing and processing circuit that includes a hybrid monochrome and color image sensor pixel array having a first subset of pixels provided by monochrome pixels without color filter elements and a second subset of pixels provided by color pixels having color filter elements. The terminal can be operative so that the image sensing and processing circuit can output a frame of image data for storing in a CPU addressable image frame memory. The image sensing and processing circuit can be operative so that a frame of image data output by the image sensing and processing circuit for storing in a CPU addressable image frame memory can include monochrome pixel values that correspond to color pixel positions of the image sensor pixel array.

29 Claims, 13 Drawing Sheets

| | | | | | |
|---|---|---|---|---|---|
| $P_{51}$ M | $P_{52}$ M | $P_{53}$ M | $P_{54}$ M | $P_{55}$ M | $P_{56}$ M |
| $P_{41}$ | $P_{42}$ M | $P_{43}$ | $P_{44}$ M | $P_{45}$ | $P_{46}$ M |
| $P_{31}$ M | $P_{32}$ M | $P_{33}$ M | $P_{34}$ M | $P_{35}$ M | $P_{36}$ M |
| $P_{21}$ | $P_{22}$ M | $P_{23}$ | $P_{24}$ M | $P_{25}$ | $P_{26}$ M |
| $P_{11}$ M | $P_{12}$ M | $P_{13}$ M | $P_{14}$ M | $P_{15}$ M | $P_{16}$ M |

| $K_{11}$ | $K_{12}$ | $K_{13}$ |
|---|---|---|
| $K_{21}$ | $K_{22}$ | $K_{23}$ |
| $K_{31}$ | $K_{32}$ | $K_{33}$ |

FIG. 7

| $P_{11}$ | $P_{12}$ | $P_{13}$ | $P_{14}$ | $P_{15}$ | $P_{16}$ | $P_{17}$ | $P_{18}$ |
|---|---|---|---|---|---|---|---|
| $P_{21}$ | $P_{22}$ | $P_{23}$ | $P_{24}$ | $P_{25}$ | $P_{26}$ | $P_{27}$ | $P_{28}$ |
| $P_{31}$ | $P_{32}$ | $P_{33}$ | $P_{34}$ | $P_{35}$ | $P_{36}$ | $P_{37}$ | $P_{38}$ |
| $P_{41}$ | $P_{42}$ | $P_{43}$ | $P_{44}$ | $P_{45}$ | $P_{46}$ | $P_{47}$ | $P_{48}$ |
| $P_{51}$ | $P_{52}$ | $P_{53}$ | $P_{54}$ | $P_{55}$ | $P_{56}$ | $P_{57}$ | $P_{58}$ |
| $P_{61}$ | $P_{62}$ | $P_{63}$ | $P_{64}$ | $P_{65}$ | $P_{66}$ | $P_{67}$ | $P_{68}$ |

$$\text{sigma}=1 : \begin{bmatrix} 2 & 4 & 2 \\ 4 & 8 & 4 \\ 2 & 4 & 2 \end{bmatrix}$$

GAUSSIAN

FIG. 9

$$\text{sigma}=0.7 : \begin{bmatrix} 1 & 4 & 1 \\ 4 & 12 & 4 \\ 1 & 4 & 1 \end{bmatrix}$$

GAUSSIAN

FIG. 10

$$\text{sigma}=0.5 : \begin{bmatrix} 0 & 3 & 0 \\ 3 & 20 & 3 \\ 0 & 3 & 0 \end{bmatrix}$$

GAUSSIAN

FIG. 11

$$\text{alpha}=1 : \begin{bmatrix} 8 & 0 & 8 \\ 0 & -32 & 0 \\ 8 & 0 & 8 \end{bmatrix}$$

LAPLACIAN

FIG. 12

$$\text{alpha}=0.6 : \begin{bmatrix} 6 & 4 & 6 \\ 4 & -40 & 4 \\ 6 & 4 & 6 \end{bmatrix}$$

LAPLACIAN

FIG. 13

$$\text{alpha}=0.4 : \begin{bmatrix} 5 & 7 & 5 \\ 7 & -48 & 7 \\ 5 & 7 & 5 \end{bmatrix}$$

LAPLACIAN

FIG. 14

$$\text{sigma}=1 : \begin{bmatrix} 6 & -1 & 6 \\ -1 & -20 & -1 \\ 6 & -1 & 6 \end{bmatrix}$$

LOG

FIG. 15

$$\text{sigma}=0.8 : \begin{bmatrix} 12 & 0 & 12 \\ 0 & -48 & 0 \\ 12 & 0 & 12 \end{bmatrix}$$

LOG

FIG. 16

$$\text{sigma}=0.7 : \begin{bmatrix} 16 & 5 & 16 \\ 5 & -84 & 5 \\ 16 & 16 & 16 \end{bmatrix}$$

LOG

|  | | | |
|---|---|---|---|
| P61 B | P62 G | P63 B | P64 G |
| P51 G | P52 R | P53 G | P54 R |
| P41 B | P42 G | P43 B | P44 G |
| P31 G | P32 R | P33 G | P34 R |
| P21 B | P22 G | P23 B | P24 G |
| P11 G | P12 R | P13 G | P14 R |

FIG. 22

TERMINAL OUTPUTTING MONOCHROME IMAGE DATA AND COLOR IMAGE DATA

FIELD OF THE INVENTION

The invention relates to sensor based terminals in general and in particular to image sensor based terminals.

BACKGROUND OF THE PRIOR ART

Image sensor based terminals are known to be used in industrial data collection applications. For example, image sensor based indicia reading terminals have been used for a number of years for purposes of decoding encoded information encoded in bar code symbols. For decoding of a bar code symbol, a captured image captured with use of an image sensor based terminal can be captured and subject to processing by application of one or more bar code decoding algorithms. Image sensor based indicia reading terminals are available either with one dimensional image sensors or two dimensional image sensors.

More recently it has become popular to incorporate color image sensors in cellular phones. In commonly available cellular phones, image sensors can be incorporated. Image sensor based cellular phones are operative to capture color frames of image data for storage on board the terminal and/or for wireless transmission to an external terminal.

SUMMARY OF THE INVENTION

There is provided an imaging terminal comprising an image sensing and processing circuit that includes a hybrid monochrome and color image sensor pixel array having a first subset of pixels provided by monochrome pixels without color filter elements and a second subset of pixels provided by color pixels having color filter elements. The terminal can be operative so that the image sensing and processing circuit can output a frame of image data for storing in a CPU addressable image frame memory. The image sensing and processing circuit can be operative so that a frame of image data output by the image sensing and processing circuit for storing in a CPU addressable image frame memory can include monochrome pixel values that correspond to color pixel positions of the image sensor pixel array.

BRIEF DESCRIPTION OF THE DRAWINGS

The features described herein can be better understood with reference to the drawings described below. The drawings are not necessarily to scale, emphasis instead generally being placed upon illustrating the principles of the invention. In the drawings, like numerals are used to indicate like parts throughout the various views.

FIG. 4 is a representation of a frame of image data;

FIG. 7 is a representation of a frame of image data;

FIG. 8 is a representation of a mask kernel which can be applied by an image sensing and processing circuit;

FIGS. 9-17 are representations of various masks as filters that can be applied by an image sensing and processing circuit;

FIG. 22 is a representation of a frame of image data;

DETAILED DESCRIPTION OF THE PREFERRED EMBODIMENTS

There is provided an image sensor based terminal 1000 comprising a hybrid monochrome and color image sensor pixel array 182 having a first subset of pixels provided by monochrome pixels devoid of color filter elements and a second subset of pixels provided by color sensitive pixels including color filter elements. In one embodiment, image sensor pixel array 182 can be incorporated in an integrated circuit 1082. Image sensor pixel array 182 can be provided as part of an image sensing and processing circuit 502 which can be operative to determine missing monochrome pixel information corresponding to color pixel positions of image sensor pixel array 182 so that CPU addressable frames on initial storage thereon can include monochrome image data corresponding to color pixel positions of the image sensor pixel array 182. Terminal 1000 can also include a CPU addressable image frame memory 1080 and a CPU 1060.

Figure 2:
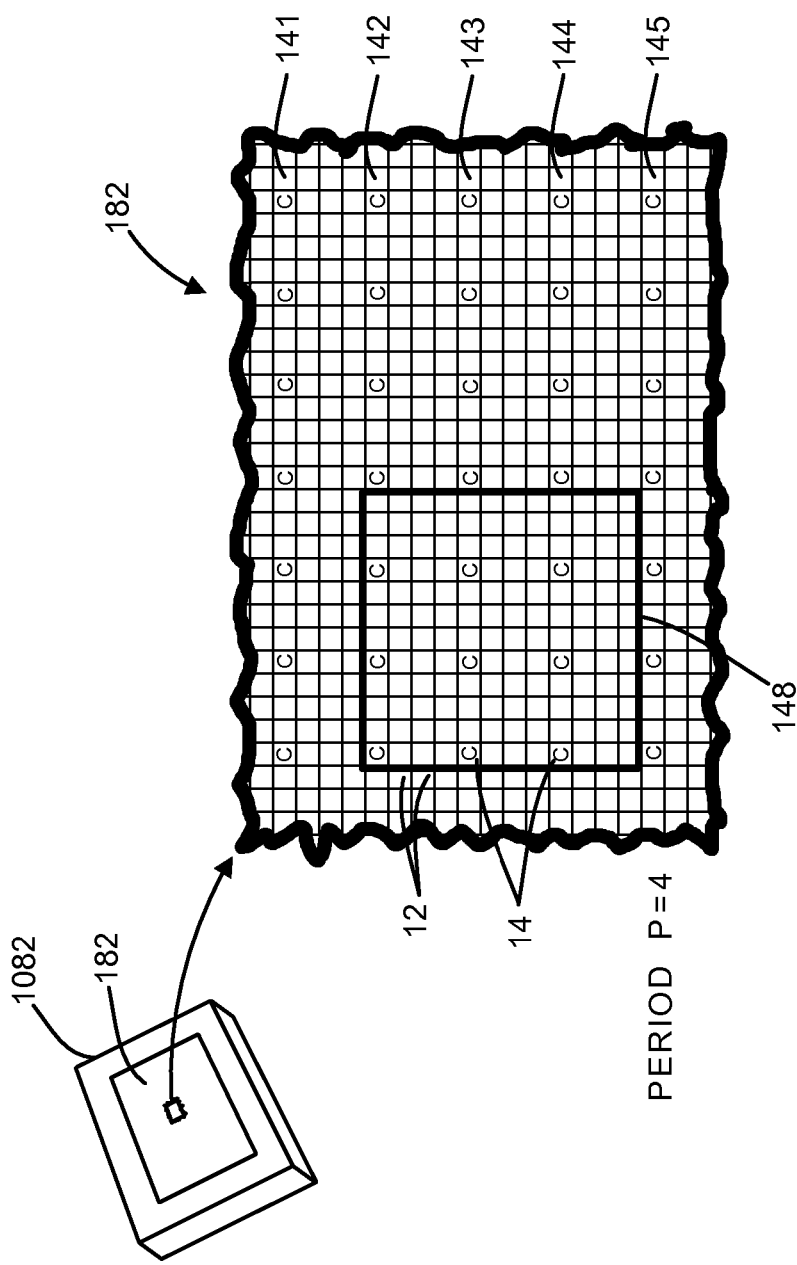
FIG. 2 is a perspective view and accompanying schematic diagram illustrating an image sensor integrated circuit having an image sensor pixel array.

Referring to FIG. 2, an image sensor pixel array 182 of an image sensor based terminal 1000 can include pixels arranged in a plurality of rows of pixels and can include a first subset of monochrome pixels 12 without (devoid) of color filter elements and a second subset of color pixels 14 including color filter elements. Such color sensitive pixels can be disposed at spaced apart positions of an image sensor pixel array 182 and can be disposed at positions uniformly or substantially uniformly throughout an image sensor pixel array 182. In one embodiment, the spaced apart color pixels of the image sensor pixel array 182, though spaced apart can follow a pattern according to a Bayer pattern. For example, where Red=R, Green=G, and Blue=B, the color pixels shown in row 141 can have the pattern . . . GRGRGRG . . . which pattern can be repeated for rows 143 and 145. The pixels of row 142 can have the pattern . . . BGBGB GB . . . , which pattern can be repeated for row 144, and such pattern can be repeated throughout image sensor pixel array 182. A color frame of image data captured with use of a color image sensor pixel array 182 having both color and monochrome pixels can include monochrome pixel image data and color pixel image data. In another embodiment, image sensor pixel array 182 can have color pixels only and can be devoid of monochrome pixels. In another embodiment, image sensor pixel array 182 can include a Bayer pattern filter. In another embodiment, image sensor pixel array 182 can be provided by a monochrome image sensor pixel array without color filter elements. Image sensor pixel array 182 can be packaged in an image sensor integrated circuit as shown in FIG. 2. Image sensor pixel array 182 can include a pattern of pixels, e.g., an M×M block (M=12 in the example shown) repeated throughout an area of image sensor pixel array 182. In one example, pattern 148 can be repeated throughout an entirety of image sensor pixel array 182.

Figure 3:
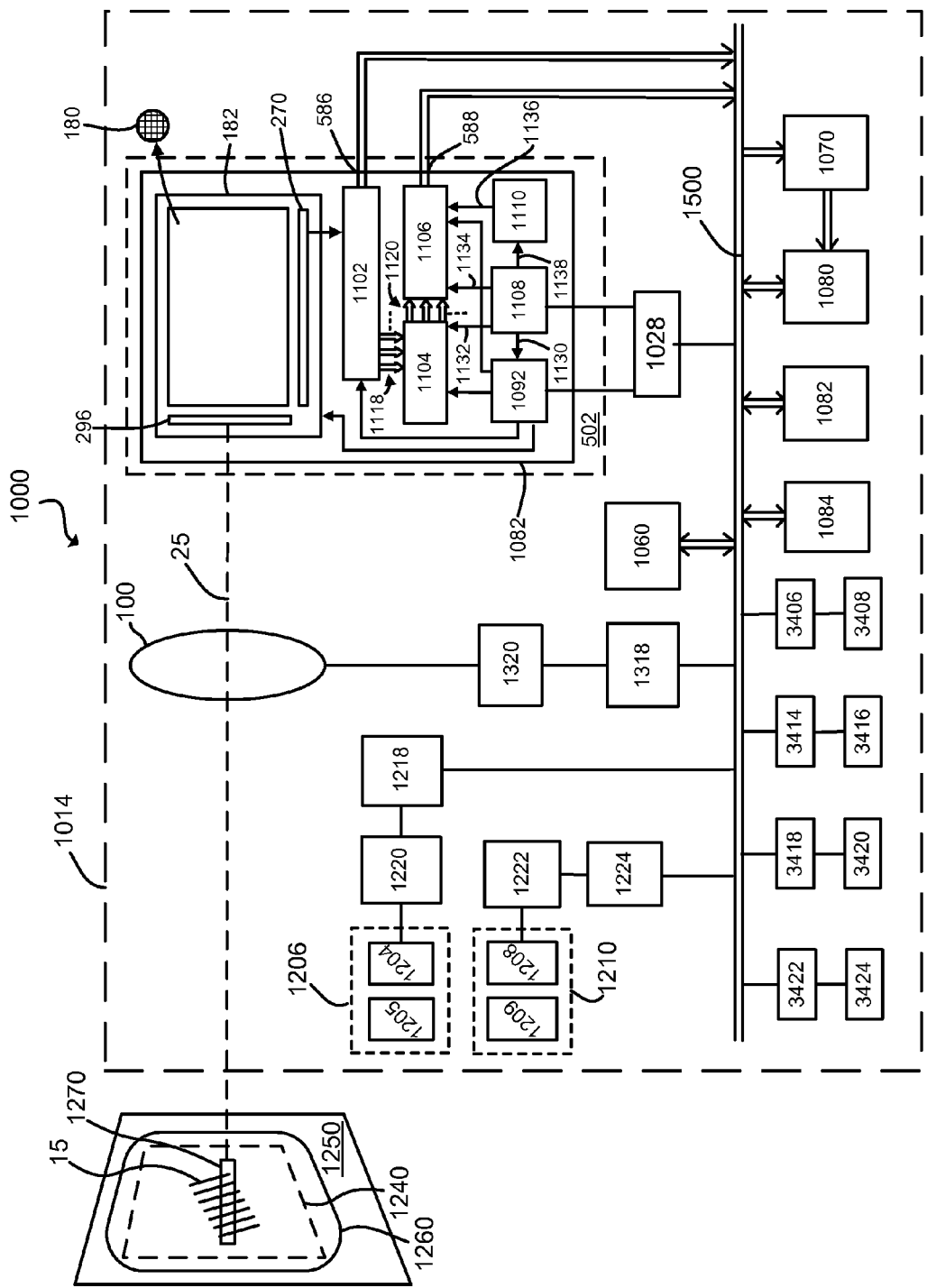
FIG. 3 is a block diagram of an imaging terminal.

In FIG. 3 there is shown a hardware block diagram for an exemplary imaging terminal 1000 which can incorporate an image sensing and processing circuit 502 having an image sensor pixel array 182 which can form part of an image sensing and processing circuit 502 as set forth herein.

Imaging terminal 1000 can include an image sensing and processing circuit 502 comprising a multiple pixel image sensor pixel array 182 having pixels arranged in rows and columns of pixels. There can be associated to image sensor pixel array 182, column circuitry 270, and row circuitry 296. Image sensing and processing circuit 502 can also have an associated timing and control circuit 1092 for use in controlling e.g., the exposure period of image sensor pixel array 182, gain applied to image signals read out from image sensor pixel array 182. The noted circuit components making up imaging sensing and processing circuit 502 in one embodiment or a subset of such components can be packaged into a common image sensor integrated circuit 1082. In one example, image sensing and processing circuit 502 can include a MT9V022 image sensor integrated circuit available from Micron Technology, Inc. modified to include color filters disposed on a subset of pixels of the integrated circuit of image sensor pixel array to define a hybrid monochrome and color image sensor pixel array as described herein. Additional features that can be used with imaging terminal 1000 are described in U.S. patent application Ser. No. 11/174,447 entitled, Digital Picture Taking Optical Reader Having Hybrid Monochrome And Color Image Sensor Array, filed Jun. 30, 2005, incorporated herein by reference. Additional features that can be used with imaging terminal 1000 are disclosed in U.S. patent application Ser. No. 12/421,476 entitled Image Sensor Pixel Array Having Output Response Curve Including Logarithmic Pattern For Image Sensor Based Terminal, incorporated herein by reference.

In the course of operation of terminal 1000, image signals can be read out of image sensor pixel array 182, converted and stored into a system memory such as RAM 1080. A memory of terminal 1000 can include one or more of RAM 1080, a nonvolatile memory such as EPROM 1082 and a storage memory device 1084 such as may be provided by a flash memory or a hard drive memory. In one embodiment, terminal 1000 can include CPU 1060 which can be adapted to read out image data stored in memory 1080 and subject such image data to various image processing algorithms. Terminal 1000 can include a direct memory access unit (DMA) 1070 for routing image information read out from image sensor pixel array 182 that has been subject to conversion to RAM 1080. In another embodiment, a system bus 1500 can include a bus arbitration mechanism (e.g., a PCI bus) thus eliminating the need for a central DMA controller. A skilled artisan would appreciate that other embodiments of the system bus architecture and/or direct memory access components providing for efficient data transfer between the image sensor pixel array 182 and RAM 1080 are within the scope and the spirit of the invention.

Referring to further aspects of terminal 1000, lens assembly 100 can be adapted for focusing an image of a decodable indicia 15 located within a field of view 1240 on a substrate 1250 onto image sensor pixel array 182. Imaging light rays can be transmitted about imaging axis 25. Lens assembly 100 can be adapted to be capable of multiple focal lengths and multiple best focus distances.

Terminal 1000 can also include an illumination pattern light source bank 1204 and associated light shaping optics 1205 for generating an illumination pattern 1260 substantially corresponding to a field of view 1240 of terminal 1000. The combination of bank 1204 and optics 1205 can be regarded as an illumination pattern generator 1206. Terminal 1000 can also include an aiming pattern light source bank 1208 and associated light shaping optics 1209 for generating an aiming pattern 1270 on substrate 1250. The combination of bank 1208 and optics 1209 can be regarded as an aiming pattern generator 1210. In use, terminal 1000 can be oriented by an operator with respect to a substrate 1250 bearing decodable indicia 15 in such manner that aiming pattern 1270 is projected on a decodable indicia 15. In the example of FIG. 3, decodable indicia 15 is provided by a 1D bar code symbol. Decodable indicia 15 could also be provided by a 2D bar code symbol or optical character recognition (OCR) characters.

Each of illumination pattern light source bank 1204 and aiming pattern light source bank 1208 can include one or more light sources. Lens assembly 100 can be controlled with use of lens assembly control unit 1320. Illumination pattern light source bank 1204 can be controlled with use of illumination light source control circuit 1220 Aiming pattern light source bank 1208 can be controlled with use of aiming pattern light source bank control circuit 1222. Lens assembly control unit 1320 can output signals for control of lens assembly 100, e.g., for changing a focal length and/or a best focus distance of (a plane of optical focus of) lens assembly 100. Lens assembly control unit 1320 can be in communication with CPU via interface circuit 1318 connected to system bus 1500. Illumination light source bank control circuit 1220 can output signals for control of illumination pattern light source bank 1204, e.g., for changing a level of illumination output by illumination pattern light source bank 1204. Aiming pattern light source bank control circuit 1222 can output signals to aiming light source bank 1208, e.g., for changing a level of illumination output by aiming light source bank 1208.

Terminal 1000 can also include a number of peripheral devices including trigger 3408 which may be used to make active a trigger signal for activating frame readout and/or certain decoding processes. Trigger 3408 can be coupled to system bus 1500 via interface circuit 3406. Terminal 1000 can be adapted so that actuation of trigger 3408 activates a trigger signal and initiates a read attempt. Specifically, terminal 1000 can be operative so that in response to activation of a trigger signal, a succession of frames can be captured by way of read out of image information from image sensor pixel array 182 and then storage of the image information after conversion into memory 1080 (which can buffer one or more of the succession of frames at a given time). Prior to storage into memory 1080, image information can be processed by image sensing and processing circuit 502. CPU 1060 can be operative to subject one or more of the succession of frames to a read attempt. For attempting to read a bar code symbol, CPU 1060 can process image data of a frame corresponding to a line of pixel positions to determine a spatial pattern of dark and light cells and can convert each light and dark cell pattern determined into a character or character string via table lookup to determine and output a message.

Terminal 1000 can include various interface circuits for coupling various of the peripheral devices to system address/data bus (system bus) 1500, for communication with CPU 1060 also coupled to system bus 1500. Terminal 1000 can include interface circuit 1028 for coupling image sensor timing and control circuit 1038 to system bus 1500, interface circuit 1218 for coupling light source bank control circuit 1220 to system bus 1500, interface circuit 1224 for coupling aiming light source bank control circuit 1222 to system bus 1500. Terminal 1000 can also include a display 3420 coupled to system bus 1500 and in communication with CPU 1060, via interface circuit 3418, as well as pointer mechanism 3410 in communication with CPU 1060 via interface circuit 3414 connected to system bus 1500, and keyboard 3424 in communication with CPU 1060 via interface circuit 3422 connected to system bus 1500. Trigger 3408 can be in communication with CPU 1060 via interface circuit 3406 connected to system bus 1500.

A succession of frames of image data that can be captured and subject to the described processing can be full frames (including pixel values corresponding to each pixel of image sensor pixel array 182 or in another embodiment each pixel of array over a predetermined area of array 182 that represents a maximum number of pixels that are read out from array 182 during a course of operation of terminal 1000). A succession of frames of image data that can be captured and subject to the described processing can also be "windowed frames" comprising pixel values corresponding to less than each pixel over a predetermined area of image sensor pixel array 182 and in some cases less than about 50% and in some cases less than 10% of pixels of image sensor pixel array 182. A succession of frames of image data that can be captured and subject to the described processing can also comprise a combination of full frames and windowed frames. A full frame can be captured by selectively addressing for read out pixels of image sensor pixel array 182 corresponding to the full frame. A windowed frame can be captured by selectively addressing for read out pixels of image sensor pixel array 182 corresponding to the windowed frame. By being operative to capture a frame of image data, terminal 1000 can be regarded as an imaging terminal.

Terminal 1000 can capture frames of image data at a rate known as a frame rate. A typical frame rate is 60 frames per second (FPS) which translates to a frame time (frame period) of 16.6 ms. Another typical frame rate is 30 frames per second (FPS) which translates to a frame time (frame period) of 33.3 ms per frame.

Figure 1:
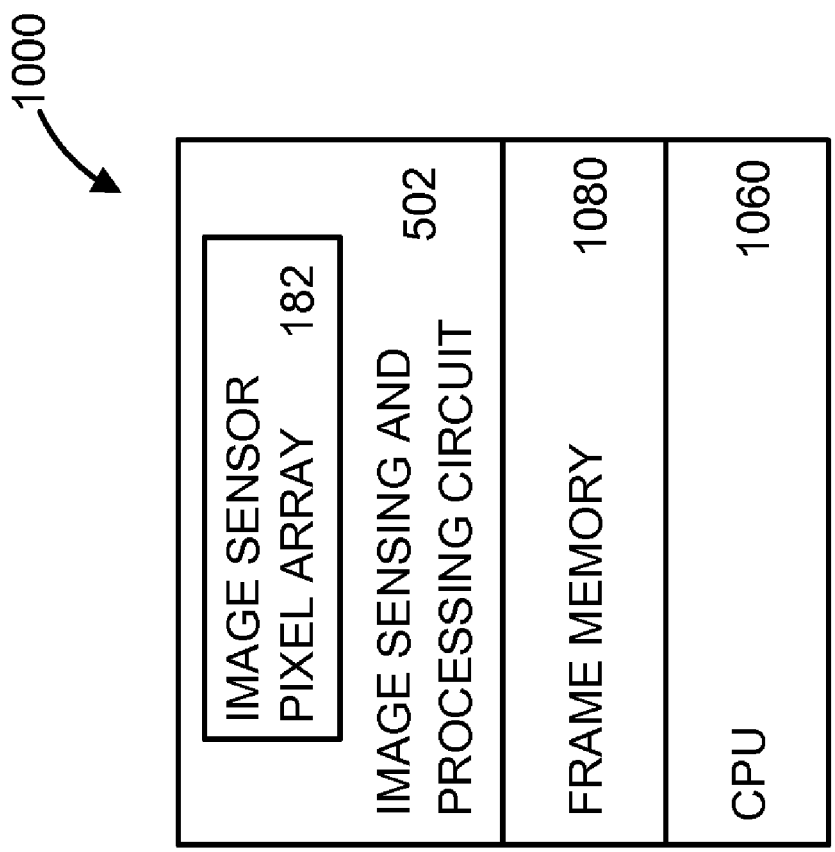
FIG. 1 is a block diagram of an imaging terminal.
Figure 6:
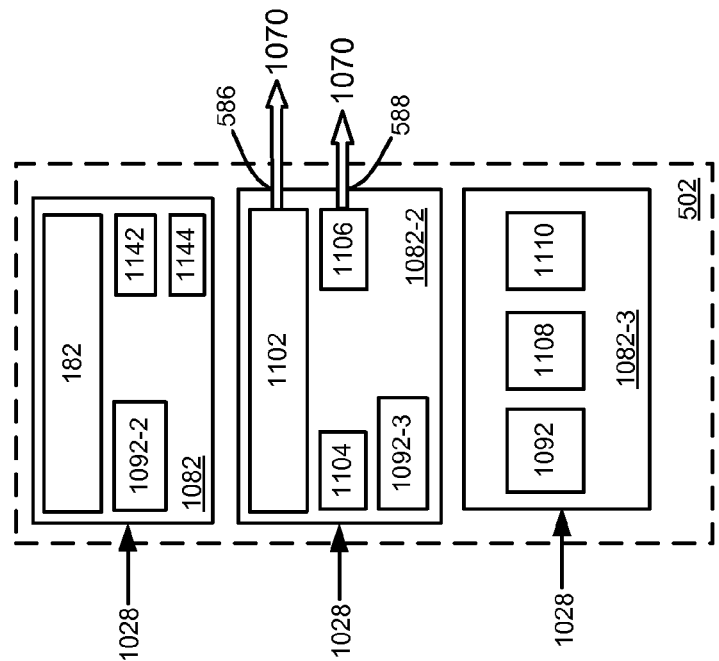
FIG. 6 is a block diagram of an image sensing and processing circuit in another embodiment.

Components of terminal 1000 described with reference to FIGS. 1-3 can be incorporated in a hand held housing, an exemplary physical form view of which is shown in FIG. 6. Image sensor 180 including image sensor pixel array 182 can be disposed in housing 1014. Referring again to the view of FIG. 3, the dashed-in border of FIG. 3 is labeled border 1014 to indicate that elements within border 1014 can be disposed within hand held housing 1014.

Referring again to the block diagram of FIG. 3, further aspects of image sensing and processing circuit 502 in one embodiment are described. Image sensing and processing circuit 502 can comprise image sensor pixel array 182 comprising a plurality of pixels formed in a plurality of rows and a plurality of columns of pixels, row circuitry 296, and column circuitry 270. Image sensor pixel array 182 can be monochrome or color and can have physical filters formed thereon in the form of standard RGB filter or physical filters in the form described in U.S. patent application Ser. No. 11/174,447, Digital Picture Taking Optical Reader Having Hybrid Monochrome And Color Image Sensor Array, filed Jun. 30, 2005 incorporated herein by reference. Column circuitry 270 can incorporate a readout circuit for reading out of image signals, typically in the form of analog voltages from pixels 180 of image sensor pixel array 182. In one embodiment, image sensor pixel array 182 is a CMOS image sensor pixel array 182.

Further referring to image sensing and processing circuit 502, image sensing and processing circuit 502 can be configured to enable processing of image data prior to storage of image data into image frame memory 1080. Image sensing and processing circuit 502 can include a row buffer circuit 1102 (N row buffer) for buffering image data corresponding to a plurality of rows of pixels of image sensor pixel array 182, a block access circuit 1104, a computational circuit 1106, a selector circuit 1108 together with control and timing circuit 1092.

For a reduction of chip size, row buffer circuit 1102 can be a multi-row analog sample and hold circuit. Row buffer circuit 1102 can also be a digital buffer circuit for buffering digital pixel values. Where row buffer circuit 1102 is a digital buffer, row buffer circuit 1102 can incorporate an analog-to-digital converter (ADC) for digitizing analog pixel voltage image signals read out from pixels 180 of image sensor pixel array 182 by the above mentioned readout circuit into the form of pixel intensity values, "or pixel values." A single ADC can be incorporated in a first pipe from column circuitry 270 to a first row buffer of row buffer circuit 1102 and the digital pixel values can ripple to the remaining row buffers of row buffer circuit 1102 without re-digitizing. Pixel values buffered by row buffer circuit 1102 can be multibit in size, e.g., 8 bit. Where pixels 180 are monochrome, pixel values corresponding to pixels 180 can be referred to as gray scale pixel values. Where pixels 180 have color filters, pixel values corresponding to pixels 180 can be referred to as color scale values. Row buffer circuit 1102 can buffer partial rows of image data, substantially complete rows of image data or complete rows of image data. In one embodiment, row buffer circuit 1102 can buffer pixel values corresponding to and representing light incident on three rows of pixels of image sensor pixel array 182. In one embodiment row buffer circuit 1102 buffers pixel values corresponding to and representing light incident on N rows of pixels of array. In a further aspect, image sensing and processing circuit 502 can be configured to output raw pixel values from row buffer circuit 1102. Image sensing and processing circuit 502 can be configured to output raw pixel values from row buffer circuit 1102 pixel by pixel and row by row until all pixel values making up an output frame of image data have been output. In one embodiment, image sensing and processing circuit 502 can be configured so that row buffer circuit 1102 is not addressable by CPU 1060.

Image sensing and processing circuit 502 also can include block access circuit 1104 which accesses blocks of image data from row buffer circuit 1102. Image sensing and processing circuit 502 can also include computational circuit 1106. Referring to further aspects of block access circuit 1104, block access circuit 1104 can access image data from row buffer circuit 1102 and can present pixel values to computational circuit 1106. So that image sensing and processing circuit 502 can output at interface 588 pixel values at a rate of one pixel value per pixel clock, block access circuit 1104 can read out a plurality of pixel values from row buffer circuit (where digital) 1102 in parallel as is indicated by array 1118 of byte outputs. Similarly, block access circuit 1104 can present a plurality of multibit pixel values to computational circuit 1106 in parallel as is indicated by byte outputs 1120. Block access circuit 1104 can access and present blocks of pixel values in e.g., 3×3 block or N×N blocks.

In one embodiment, where image sensor pixel array 182 is a hybrid monochrome and color image sensor pixel array, image sensing and processing circuit 502 with utilization of row buffer circuit 1102 (N row buffer) can be operative to determine missing monochrome pixel values corresponding to color pixel positions. Block access circuit 1104 can read out a plurality of pixel values from row buffer circuit 1102 (N row buffer) and can present an N×N block of pixel values to computational circuit 1106 which can be operative to determine (e.g., interpolating) missing monochrome pixel values corresponding to color pixel positions.

In FIG. 4, there is illustrated a frame of image data having a plurality of pixel positions. Pixel positions $P_{21}$, $P_{41}$, $P_{23}$, $P_{43}$, . . . are missing pixel positions corresponding to color sensitive pixels, 250C of image sensor pixel array 182B. Referring to the frame of image data represented at FIG. 4 terminal 1000 may calculate a gray scale pixel value for color pixel positions, e.g., position $P_{23}$, by averaging the gray scale values for each pixel position that is adjacent to pixel position $P_{23}$ and each pixel position that is corner adjacent to color pixel position $P_{23}$. For example, referring to the frame represented in FIG. 4, a gray scale value for color pixel position $P_{23}$ can be interpolated by averaging pixel values of pixel positions $P_{12}$, $P_{22}$, $P_{32}$, $P_{13}$, $P_{33}$, $P_{14}$, $P_{24}$, and $P_{34}$. A pixel value for "missing pixel" position $P_{23}$ can also be interpolated utilizing more than 8 neighboring pixel positions. Also, corner adjacent pixels may be weighted less than side, top or bottom adjacent pixels during averaging. In one simple averaging method, only four surrounding pixels are averaged; namely, the top and bottom adjacent pixels and the two side adjacent pixels adjacent to the pixel position for which a gray scale value is being interpolated. In a still further interpolation method, only two pixels are used for averaging; namely, either the two side adjacent pixels adjacent to the pixel position being interpolated or the top and bottom adjacent pixels. A two dimensional image representation of a linear bar code symbol can be expected to have several consecutive pixel positions along a column with similar gray scale values, if the representation of the symbol is oriented with 0° or 180° angle of rotation (i.e., the symbol is right side up or upside down). If the symbol representation has a 90° or 280° angle of rotation, several consecutive pixel positions along rows of pixel positions can be expected to have similar valued gray scale values. Accordingly, it can be seen that interpolating pixel values of adjacent pixel position values running in the direction of bars in a symbol representation yields truer edge information than utilizing all surrounding pixel positions for interpolation.

In one method of the invention, the correlation between a pair of horizontally oriented scan lines is calculated along with a correlation between a pair of vertically oriented scan lines. The two correlation measurements are then compared. If row scan lines are more closely correlated, column adjacent pixels are selected for interpolation. If column scan lines are more closely correlated, row adjacent pixels are selected for interpolation. An exemplary set of code for calculating a first derivative correlation for a pair of scan lines (horizontal or vertical) is presented by Table 1.

TABLE 1

Exemplary Code For Performing First Derivative Correlation Calculation

```
%OneDcorelate: correlates two 1D 1st derivative signals to report the
%correlation
%input a,b: 1D array
%output c: 1st derivative correlation
function c=OneDcorrelate(a,b)
% "diff" is the first derivative calculation.
%for an input array a=[a_i]_{i-1}^n then diff(a) =[a_i – a_{i+1}]_{i-1}^{n-1}
da=diff(double(a));
db=diff(double(b));
n=length(da);
c=0;
for i=1:n
    c=c+da(i)*db(i);
end
```
[End Table 1]

A set of code for interpolating missing color pixel position values by one of three methods (first derivative correlation, simple correlation, and simple averaging) wherein "M-set" refers to the monochrome set of pixels is presented in Table 2.

TABLE 2

Exemplary Code For Interpolating Missing Pixels Corresponding To Color Pixel Positions

```
% MsetInterpolation: interpolates missing M-set pixels
%input I_Mset: M-set image
%input method: 1:first derivative correlation; 2: simple correlation; 3:
%simple averaging
%input p: sample period
%output Im: interpolated monochrome image
function Im=MsetInterpolation(I_Mset,method,p)
Isz=size(I_Mset);
%M-set topology
%
% MMMMMMMMM
% MxMxMxMxM
% MMMMMMMMM
% MxMxMxMxM
%(MMMMMMMMM)
%     v
Im=double(I_Mset);
m=Isz(1);
n=Isz(2);
%correlated averaging
for i=p:p:m
  for j=p:p:n
    if i+1 <=m & j+1 <=n
      if method == 2
        %simple correlation
        if abs(Im(i−1,j)−Im(i+1,j)) < abs(Im(i,j−1)−Im(i,j+1))
          Im(i,j)=(Im(i−1,j)+Im(i+1,j))/2;
        else
          Im(i,j)=(Im(i,j−1)+Im(i,j+1))/2;
        end
      else if method == 1
        %first derivative correlation
        if OneDcorrelate(Im(i−1,j−1:j+1),Im(i+1,j−1:j+1)) >
OneDcorrelate(Im(i−1:i+1,j−1),Im(i−1:i+1,j+1))
          Im(i,j)=(Im(i−1,j)+Im(i+1,j))/2;
        else
          Im(i,j)=(Im(i,j−1)+Im(i,j+1))/2;
        end
      else %method==3
        %simple averaging
        Im(i,j)=(Im(i−1,j)+Im(i+1,j)+Im(i,j−1)+Im(i,j+1))/4;
      end
    else if i+1 <=m & j+1 > n
      Im(i,j)=(Im(i−1,j)+Im(i+1,j))/2;
    else if i+1 > m & j+1 <=n
      Im(i,j)=(Im(i,j−1)+Im(i,j+1))/2;
    else if i+1 > m & j+1 > n
      Im(i,j)=(Im(i−1,j)+Im(i,j−1))/2;
    end
  end
end
Im=uint8(Im);
```
[End Table 2]

With further reference to image sensing and processing circuit 502, image sensing and processing circuit 502 can include control/timing circuit 1092, selector circuit 1108, and mask data circuit 1110. In response to a trigger signal being activated, control/timing circuit 1092 can send exposure control, reset, and readout signals to image sensor pixel array 182 for effecting image signal readout of pixels of image sensor pixel array 182. As is indicated by the various control lines extending from control/timing circuit 1092, control/timing circuit 1092 can be in communication with row buffer circuit 1102, block access circuit 1104, and computational circuit 1106. In one embodiment, CPU 1060 and image sensing and processing circuit 502 can be in communication via I²C interface 1028. CPU 1060 can send various commands to image sensing and processing circuit 502 over I²C interface 1028, e.g., reset commands, exposure setting commands, sleep commands, and the like. CPU 1060 can also send filter mask kernel data and other configuration data to image sensing and processing circuit 502 over I²C interface 1028. Terminal 1000 can be configured so that a trigger signal activated received e.g., when a trigger 3408 is actuated, when a trigger command is received from an external device initiated by a user of the external device, when the terminal 1000 is powered up or when the presence of an object in the field of view of image sensor pixel array 182 is detected. Terminal 1000 can be configured so that a trigger signal is activated, e.g., responsively to an initiation received by way of manual actuation of trigger 3408 in communication with CPU 1060 responsively to a trigger command received from an external device initiated by a user of the external device, or responsively to a detection of an object in the field of view of image sensor pixel array 182.

When outputting a frame of image data for storage into CPU addressable image frame memory 1080, terminal 1000 may output pixel values corresponding to all or less than all pixels 180 of an image sensor pixel array 182. Frames stored into image frame memory 1080 can be regarded as buffered frames (and image frame memory 1080 can be regarded as a buffer memory) where terminal 1000 is operative to store a succession of frames into image frame memory 1080 utilizing common address locations of the image frame memory 1080. Pixels of image sensor pixel array 182 can be selectively addressed for readout so that image signals corresponding to less than all pixels of array 182 are read out. A frame rate can be increased (and a frame period can be decreased) by reading out image signals corresponding to a few number of pixels of image sensor pixel array 182. Also, image sensing and processing circuit 502 can be configured to refrain from digitizing each pixel light representing image signal that is read out from image sensor pixel array 182. During a frame read out period, image signals corresponding to charges at all or less than all of the pixels of image sensor pixel array 182 can be read out. Image sensing and processing circuit 502 when outputting a frame of pixel values can output pixel values corresponding to less than all pixels of the image sensor pixel array 182 when, for example, less than all of the pixels of the array have been selectively addressed for readout, or when image sensing and processing circuit 502 has refrained from developing a pixel value for each pixel light representing image signal that has been read out of array. When outputting pixel values representing light incident at less than all pixels of an array 182, image sensing and processing circuit 502 can nevertheless output a set of pixel values representing a two dimensional area, e.g., a two dimensional area representing a bar code or other decodable indicia disposed on a substrate. The set of pixel values can correspond to less than all pixels of image sensor pixel array 182, but nevertheless can correspond to a contiguous grouping of pixels representing a two dimensional area.

Image sensor pixel array 182 has been described herein as a two dimensional image sensor pixel array 182. Image sensor pixel array 182 can also be a one dimensional image sensor pixel array 182, having, e.g., 1280×1 or 1280×2 (2 rows) of pixels. While image sensing and processing circuit 502 can output a frame of image data made up of pixel values corresponding to a contiguous 2D grouping of pixels representing a 2D area, image sensing and processing circuit 502 can also output a frame of image data made up of pixel values corresponding to linear groups of pixels (e.g., pixel values corresponding to a row of pixels or a pair of rows, or a diagonal row). Where image sensing and processing circuit 502 outputs a linear frame of image data, image sensing and processing circuit 502 can include either a 1D or 2D image sensor pixel array 182.

A frame of image data stored into image frame memory 1080 can include a set of pixel values corresponding to pixels of image sensor pixel array 182. Each pixel value of a frame of image data can represent light at a certain pixel of the image sensor pixel array 182 and a pixel value that represents light at a certain pixel can be regarded as pixel value corresponding to the certain pixel. Terminal 1000 including image frame memory 1080 can be configured so that the set of pixel values making up a frame of image data are simultaneously retained (stored) in image frame memory 1080, which can be addressable by CPU 1060. The set of pixel values that can be simultaneously retained by a CPU addressable image frame memory 1080 can correspond to a greater number of pixel array rows than the number of pixel array rows represented by image information retained by N row buffer 1102 of image sensing and processing circuit 502. The pixels of image sensor pixel array 182 to which a set of pixel values correspond can be a contiguous grouping of pixels, i.e., a set of pixels wherein each pixel is adjacent (right, left, up, down, or corner adjacent to at least one other pixel of the set). A set of pixel values corresponding to a contiguous grouping of pixels can be regarded as a contiguous set of pixel values. A set of pixel values making up a frame of image data can represent a 2D area of a substrate such as a substrate bearing a decodable indicia, or a 1D slice region of a substrate bearing a decodable indicia. An exemplary set of pixel values representing a 2D area would be a set of pixel values corresponding to each pixel of a two dimensional image sensor pixel array 182 or to a set of pixels of a two dimensional image senor array defining a two dimensional area. An exemplary set of pixel values representing a 1D slice region of a substrate would be a set of pixels corresponding to a single row of pixels of a one dimensional or two dimensional image sensor pixel array 182.

Regarding selector circuit 1108, terminal 1000 can be configured so that selector circuit 1108 is responsive to user-initiated commands entered into a user interface of terminal 1000 (e.g., display 3420 which can be a touch screen display and/or keyboard 3424 and/or pointer mechanism 3416). In one embodiment, terminal 1000 can be configured so that a user can change an operating configuration of terminal 1000 effecting operation of image sensing and processing circuit 502. For enabling a user to change an operating configuration, terminal 1000 can be configured so that when a user enters with terminal 1000 in an appropriate time (such as a state in which a menu is presented) control signals using a user interface, CPU 1060 sends an appropriate configuration change command to configuration selector circuit 1108. As is indicated by control lines 1130, 1132, 1134, 1136, 1138 configuration selector circuit 1108 can reconfigure one or more of control/timing circuit 1092, block access circuit 1104, computational circuit 1106 and mask data circuit 1110 in response to receipt of a configuration change command.

In one embodiment, image sensing and processing circuit 502 can apply mask filters to blocks of pixel values. Referring to mask data circuit 1110, mask data circuit 1110 can store one or plurality of candidate masks e.g., a Laplacian mask, a Gaussian mask, an LoG mask, an LoG mask with a different set of parameters, etc. Mask data circuit 1110 can send a selected mask to computational circuit 1106 for use by computational circuit 1106 in calculating filtered pixel values. However, in some use cases, mask data circuit 1110 need not send any mask data to computational circuit 1106. For example, where computational circuit 1106 is configured in a configuration in which computational circuit 1106 is to perform mean or median filtering only, mask data circuit 1110 need not send mask data to computational circuit 1106. In one embodiment, each of image sensor pixel array 182, row buffer circuit 1102, block access circuit 1104, computational circuit 1106, control/timing circuit 1092, configuration selector circuit 1108 (selector circuit) and mask data circuit 1110 can be integrated on a single integrated circuit 1082. Also, DMA 1070 can be incorporated into integrated circuit 1082. The circuit design of image sensing and processing circuit 502 can be optimized with use of suitable silicon compiler software.

Terminal 1000 can be configured so that image sensing and processing circuit 502 outputs various data, including image data for storage into image frame memory 1080. For outputting data for storing (e.g., buffering) into image frame memory 1080, image sensing and processing circuit 502 can output data to DMA 1070. DMA 1070 provides direct memory access (DMA) functionality, allowing pixel values or other data to be stored into image frame memory 1080. DMA circuits can buffer image data and transmit buffered image data in bursts to an image frame memory 1080. In one embodiment, image frame memory 1080 can be provided by a multi-port RAM. CPU 1060 can be incorporated into a microprocessor IC chip having integrated DMA frame grabbing functionality. An example of microprocessor IC having integrated DMA frame grabbing circuitry is the XSCALE PXA27X processor with "Quick Camera Interface" available from Intel.

In the embodiment of FIG. 3, the components of image sensing and processing circuit 502 are incorporated on the single integrated circuit; namely integrated circuit 1082. The components of image sensing and processing circuit 502 can also be distributed among more than one integrated circuit.

Figure 5:
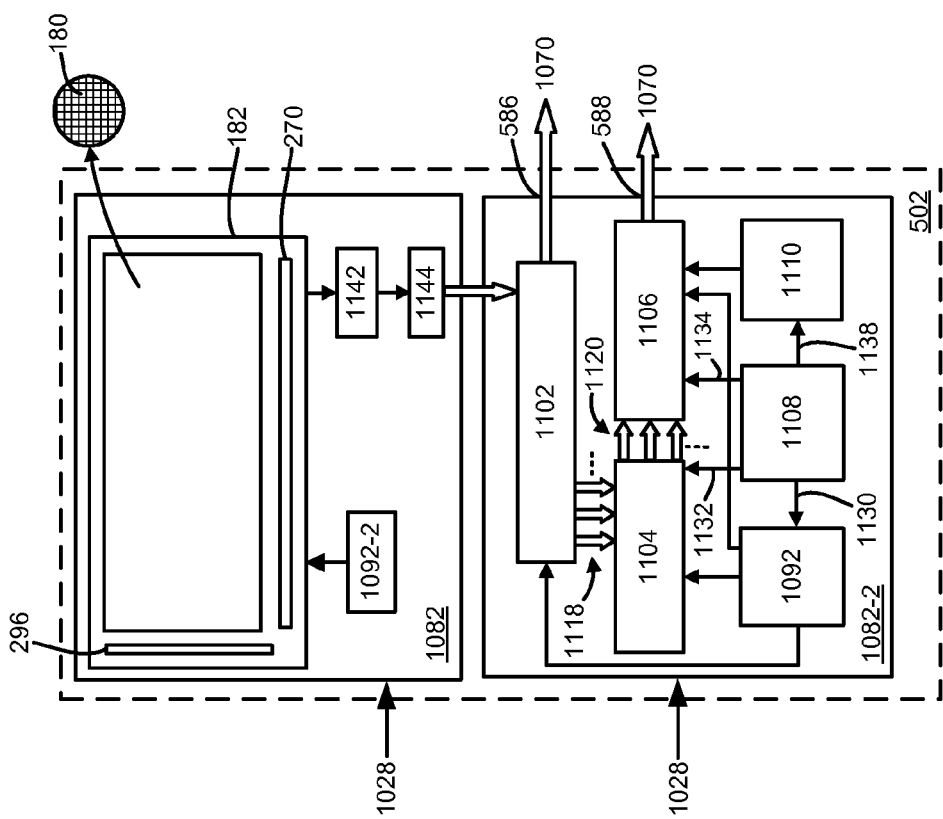
FIG. 5 is a block diagram of an image sensing and processing circuit in one embodiment.

In the embodiment of FIG. 5, image sensing and processing circuit 502 can include two integrated circuits; namely, image sensor integrated circuit 1082, and integrated circuit 1082-2. Image sensor integrated circuit 1082 can include additional control and timing circuit 1092-2, gain block 1142 and analog to digital converter 1144. Integrated circuit 1082-2 can include row buffer circuit 1102, block access circuit 1104, computational circuit 1106, control/timing circuit 1092, configuration selector circuit 1108, and mask data circuit 1110 as described herein.

In the embodiment of FIG. 6, image sensing and processing circuit 502 can include three integrated circuits; namely, image sensor integrated circuit 1082, integrated circuit 1082-2 and integrated circuit 1082-3. Integrated circuit 1082 can include the component described with reference to FIG. 3. Integrated circuit 1082-2 can incorporate row buffer circuit 1102, block access circuit 1104, computational circuit 1106, and additional control/timing circuit 1092-3 while integrated circuit 1082-3 can include control/timing circuit 1092, selector circuit 1108, and mask data circuit 1110.

In the embodiment of FIGS. 5 and 6, image sensor integrated circuit 1082 can be provided by a commercially available off-the-shelf image sensor integrated circuit such as an MT9V022 or MT9M413 (monochrome or color) image sensor integrated with TRUESNAP global electronic shutter of the type available from MICRON, Inc.

Terminal 1000 has been described as indicia reading apparatus for reading decodable indicia such as bar codes and Optical Character Recognition (OCR) characters. Also, combinations of elements of terminal 1000 can find use outside of an indicia decoding application. Exemplary image data processing functionality which can be incorporated into terminal 1000 is described in U.S. patent application Ser. No. 10/958,779 (now U.S. Pat. No. 7,293,712) incorporated herein by reference.

In one aspect, image sensing and processing circuit 502 can be configured to process pixel values making up a frame of image data prior to storage of the pixel values into image frame memory 1080. In one example of such processing, image sensing and processing circuit 502 can determine missing monochrome pixel values corresponding to color pixel positions. Alternatively or additionally, raw pixel values can be output by image sensing and processing circuit 502 for storage into image frame memory 1080 and CPU 1080 under control of an appropriate program, can digitally process pixels after storage into image frame memory 1080. By configuring image sensing and processing circuit 502 to process pixel values prior to storage into image frame memory 1080 for determining monochrome pixel values corresponding to color pixel positions decoding speed can be significantly increased. There is set forth herein a method comprising providing a hand held imaging terminal having an image sensor pixel array, a trigger, a microprocessor addressable image frame memory, and a microprocessor in communication with the microprocessor addressable image frame memory, the image sensor pixel array having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions; actuating said trigger to initiate a trigger signal; responsively to the initiation of the trigger signal, reading out image signals from a contiguous grouping of pixels of said image sensor array, the image signals comprising an analog intensity value for each pixel of the grouping, the analog intensity value for each pixel indicating light incident on the pixel; digitizing analog intensity values read out into a pixel values to form a set of pixel values making up a frame of image data; prior to output of said frame of image data for storage of said frame of image data into said image frame memory, processing said frame of image data for determination of monochrome pixel values corresponding to pixels of the second subset of pixels; storing a processed frame image data into said image frame memory, the processed frame of image data having said determined monochrome pixel values corresponding to color pixel positions; and addressing pixel values of said processed frame of image data stored into said image frame memory.

Computational circuit 1106 where configured to perform digital filtering, can filter pixel values and can output filtered pixel values. Several types of digital filter processes can be carried by application of digital masks. For example, Gaussian, Laplacian, and LoG filtering can be carried out by convolving a block of pixels with a predetermined mask having a dimension (3×3, 4×4) equal to the dimension of the block of pixels. Where image sensor pixel array 182 is a linear image sensor pixel array 182, linear kernels, e.g., N×1 kernels can apply for filtering. When configured to carry out Gaussian filtering, computational circuit 1106 can convolve for each pixel value output by circuit 1080 making up a frame of image data, a block of pixel values received from block access circuit 1104 with a Gaussian mask. When configured to carry out Laplacian filtering, computational circuit 1106 can convolve for each pixel value output by circuit 1080 making up a frame of image data, a block of pixel values received from block access circuit 1104 with a Laplacian mask. When configured to carry out LoG filtering, computational circuit 1106 can convolve for each pixel value output by circuit 1080 making of a frame of image data, a block of pixel values received from block access circuit 1104 with a LoG mask. For the pixel value at pixel position $P_{22}$ as shown in FIG. 7, the result of convolving the pixel value at position $P_{22}$ with a 3×3 kernel as shown in FIG. 8 can be given by Eq. 1 below $$C_{22}=P_{11}K_{11}+P_{12}K_{12}+P_{13}K_{13}+P_{21}K_{21}+P_{22}K_{22}+P_{31}K_{31}+P_{32}K_{32}+P_{33}K_{33} \quad \text{Eq. 1}$$

Alternative candidate Gaussian filter masks are shown in FIGS. 9, 10, and 11. Alternative Laplacian filter masks are shown in FIGS. 12, 13, and 14. Alternative LoG filter masks are shown in FIGS. 15, 16, and 17.

Computational circuit 1106 can carry out filtering processes, such as mean and median filtering, that do not require application of a digital mask (mask kernel). For carrying out mean filtering, computational circuit 1106 can average, for each pixel value output making up a frame, a block of pixels received from block access circuit 1104. For carrying out median filtering, computational circuit 1106 can sort, for each pixel value output making up a frame, the pixel values of the block and select the median value as the filtered pixel output value.

The dynamic range of filtered pixel values output at interface 588 can be expected to change when filter masks having different sets of parameters are applied to pixel values prior to storage into image frame image memory 1080. Terminal 1000 can be configured so that a user may adjust a format of image data output at interface 588 by way of inputting commands into a user interface or terminal 1000. With terminal 1000 configured so that a user can adjust a format of image data at interface 588, a user may adjust a format of image data output at interface 588 to a floating point format, e.g., IEEE 754 Floating Point format, if a user expects application of a certain digital filter mask to result in a set of pixel values having a large dynamic range to be output at interface 588. When image sensing and processing circuit 502 adjusts a format of pixel values being output, it can also output data for reading by CPU 1060 indicating that a format of pixel value has been changed.

In one embodiment image sensing and processing circuit 502 can be configured to monitor a dynamic range of a set of pixel values being output at interface 588 and to automatically adjust a pixel value format of output pixel values to a floating point format, e.g., IEEE 754 Floating Point, if image sensing and processing circuit 502 determines that that a dynamic range of a set of pixel values has exceeded a predetermined dynamic range. When image sensing and processing circuit 502 adjusts a format of pixel values being output, it can also output data for reading by CPU 1060 indicating the present format of output pixel values.

While image sensing and processing circuit 502 can be configured to process pixel values for determining pixel values corresponding to color pixel positions or to filter pixel values making up a frame of image data, image sensing and processing circuit 502 need not filter any pixel values and in one embodiment, processes image data only to the extent that it passes pixel values for output through an output interface. In one embodiment, image sensing and processing circuit 502 can include a single output interface for outputting raw pixel values.

In another aspect, image sensing and processing circuit 502 can be configured to contemporaneously output for storing (e.g., buffering) into image frame memory 1080 two frames of image data; one raw frame of image data and one processed frame of image data. The processed frame of image data can be processed for determining a pixel value corresponding to a color pixel position, and/or can be processed by application of a filter as set forth herein. For contemporaneously outputting two frames of image data, image sensing and processing circuit 502 can, e.g., simultaneously output two frames, e.g., so that there is at least some overlap in the periods during which the frames are being output at respective first and second interfaces, and/or can synchronously output image data by utilizing a common pixel clock to output image data, e.g., raw and filtered pixel values making up two different frames. The frames of image data can be output within a single frame period. Where image sensing and processing circuit 502 contemporaneously outputs two frames of image data, CPU 1060 can be provided with fast access (i.e., capacity to address) to both raw and filtered image data. Image sensing and processing circuit 502 can contemporaneously output both raw pixel values representative of light incident on pixels of array 182 and pixels values representative of digitally filtered light incident on pixels of array 182.

In a further aspect as shown in FIG. 3, a image sensing and processing circuit 502 can have dual pixel value output interfaces; namely, first output interface 586 for outputting raw pixel values and second output interface 588 for outputting filtered pixel values. Image sensing and processing circuit 502 can contemporaneously output raw and processed pixel values at interfaces 586, 588, e.g., by outputting raw and processed pixel values simultaneously with at least some overlap in the output times and/or synchronously using a common pixel clock to clock out pixel values at interface 586 and interface 588 respectively. When outputting image data, interfaces 586, 588 can be regarded as image data output interfaces. Image sensing and processing circuit 502 can be configured to continuously output, in parallel "pairs" of contemporaneously output raw and filtered frames of image data. Each of interface 586, 588 can be alternatively termed a "bus," a "port," a "set of contacts," ("contact set" or "set of pins" ("pin set") where constituted by a set of pins. It has been mentioned that interface 590 can repeat the output at interface 586 and that interface 592 can repeat the output at interface 588. Each of interface 590 and interface 592 like interface 586 and interface 588 may alternatively be termed a "bus" a "port" a "set of contacts," ("contact set" or "set of pins" ("pin set") where constituted by a set of pins. "Pixel values" as described herein can be multibit pixel values. For pixel positions where image sensor pixel array 182 is devoid of color filters, such pixel values are commonly referred to as "gray scale" pixel values. For pixel positions where image sensor pixel array 182 has color filters, such pixel values are commonly referred to as color scale values when corresponding to a pixel having a physical filter.

Figure 20:
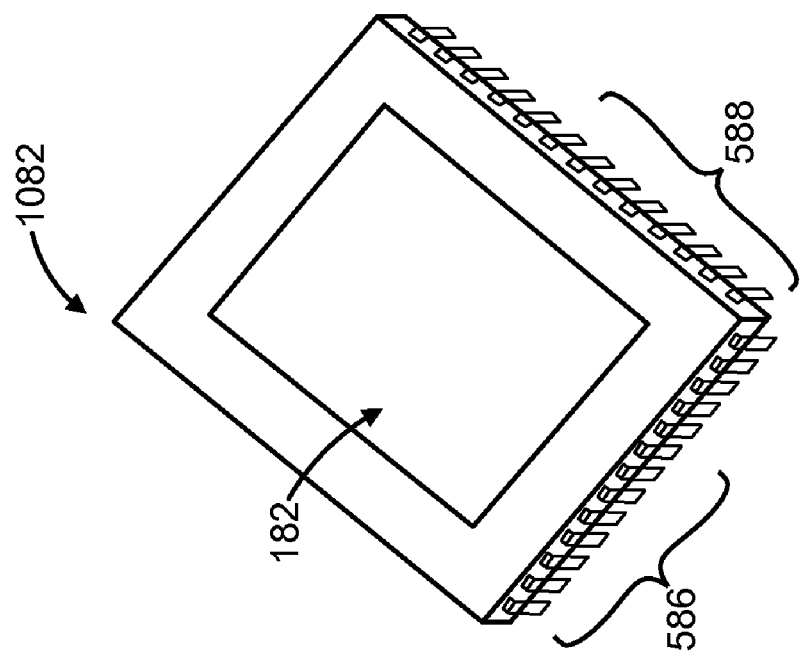
FIG. 20 is a perspective physical form view of an image sensing and processing circuit in one embodiment incorporated in an integrated circuit.

Exemplary physical form views of interfaces 586, 588, are shown in FIG. 20, illustrating an exemplary integrated circuit configuration in which the interfaces may be incorporated. In FIG. 20, there is shown an image sensor integrated circuit 1082 which can have a first interface 586 provided by a set of pins through which raw pixel values can be output, and a second interface 588 provided by a set of pins through which processed pixel values can be output, e.g., for storage into CPU addressable image frame memory 1080.

Figure 18:
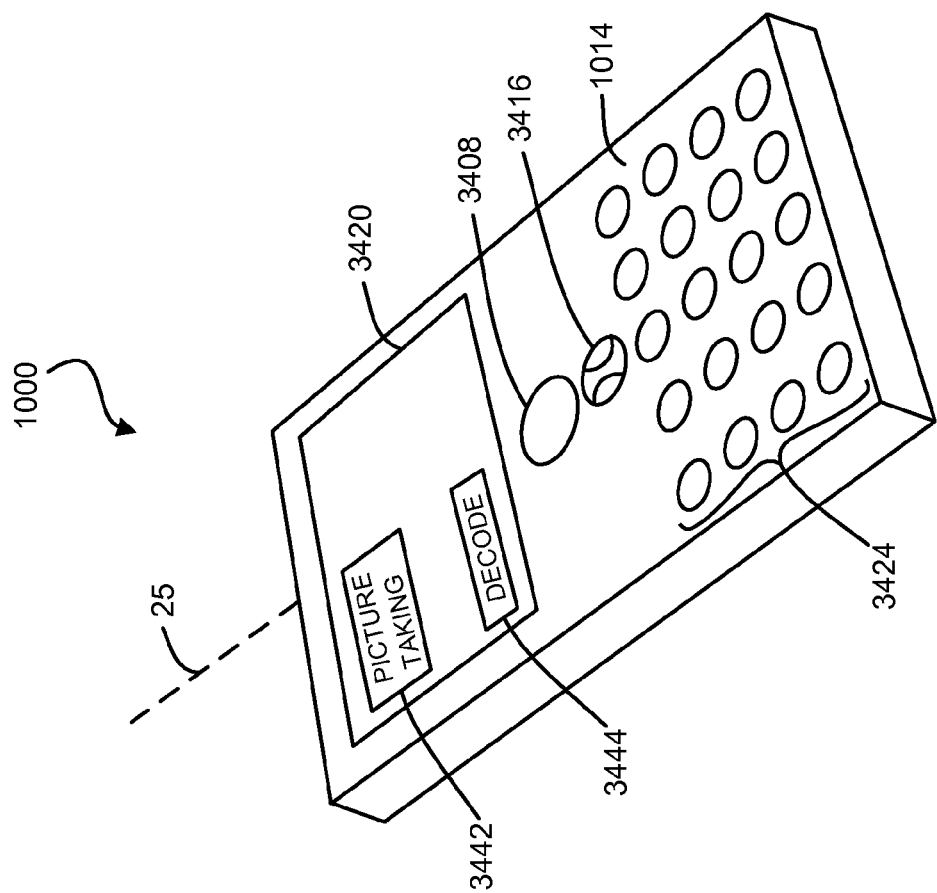
FIG. 18 is a perspective physical form view of an imaging terminal in one embodiment.

A physical form value of terminal 1000 in one embodiment is shown in FIG. 18. Terminal 1000 can include housing 1014, which can encapsulate elements within dashed-in line 1014 (indicating housing 1014) of FIG. 3. In one example a decode mode can be activated by actuation of button 3444 and a trigger signal can later be actuated by actuation of trigger 3408 which can be disposed on housing 1014. There can also be disposed on housing 1014 display 3420, pointer mechanism 3416, and keyboard 3424. A picture taking mode can be activated by actuation of button 3442 and a trigger signal can later be activated by actuation of trigger 3408. In another example, buttons 3442, 3444 can be configured to simultaneously serve as mode selectors and trigger signal activation buttons so that actuation of either button 3442 or button 3444 simultaneously selects the mode corresponding to the button and activates a trigger signal.

Figure 19:
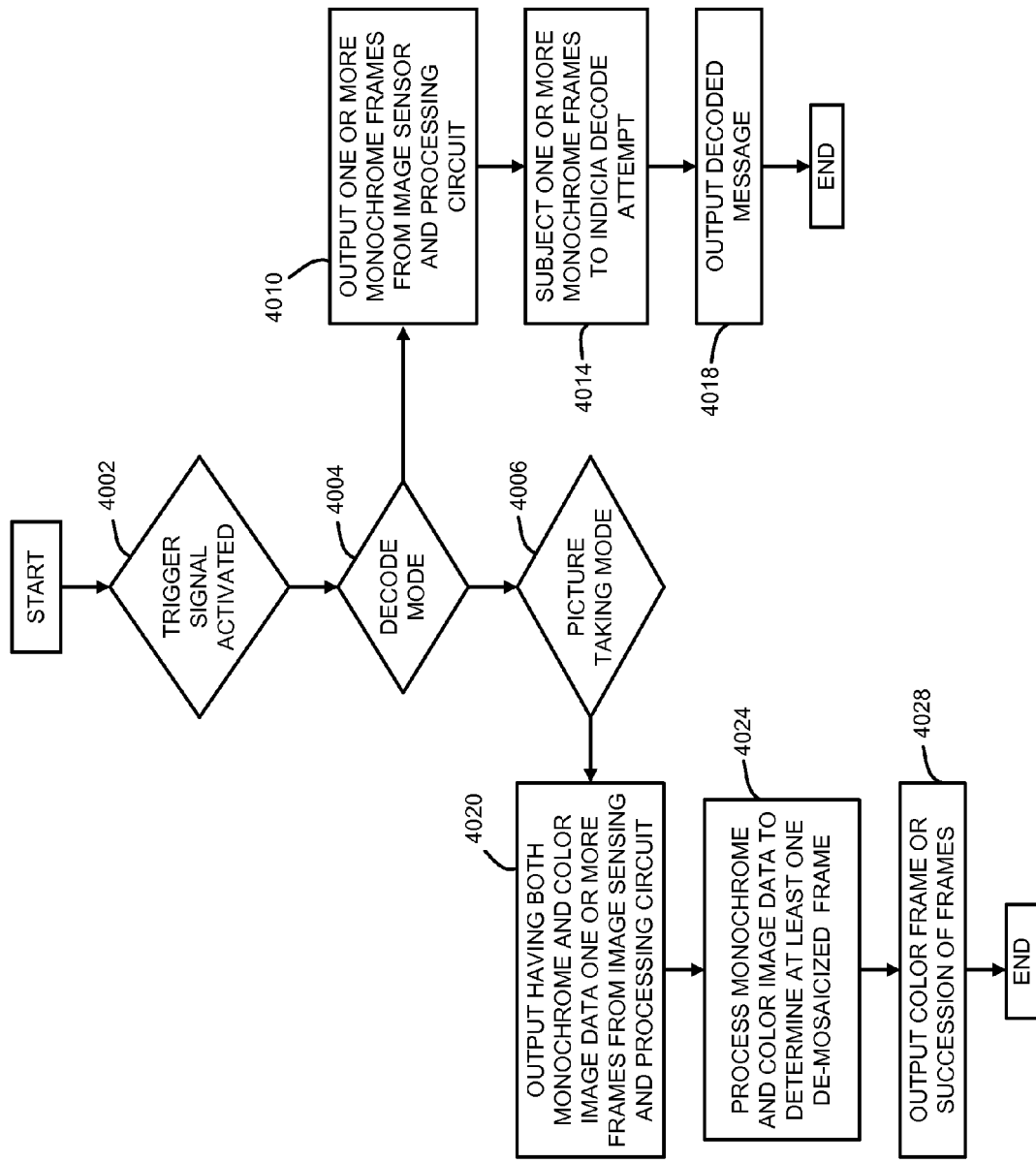
FIG. 19 is a flow diagram illustrating operation of an imaging terminal in one embodiment.

Reference is now made to the flow diagram of FIG. 19. At block 4002, terminal 1000 can determine if a trigger signal is active. If yes, terminal 1000 can proceed to blocks 4004, 4006 to determine if an indicia decode mode or picture taking mode has been selected and is active. Examples of how a decode mode and/or picture taking mode can be made active have been described with reference to FIG. 18. If a decode mode is active, terminal 1000 can proceed to blocks 4010, 4014. If a picture taking mode is active, terminal 1000 can proceed to blocks 4020, 4024, 4028.

At block 4010, terminal 1000 can output one or more monochrome frames. In one embodiment, the one or more frames can be a succession of frames. For output of a monochrome frame where image sensor pixel array 182 is a hybrid monochrome and color image sensor pixel array image sensing and processing circuit 502 can determine monochrome pixel values corresponding to color pixel positions, e.g., in a manner set forth with reference to FIG. 4.

Reference will now be made to blocks 4010, 4014, 4018 active during a decode mode of operation. For output of such frames, image sensing and processing circuit 502 can output the frames to CPU addressable image frame memory 1080. Image frame memory 1080 can simultaneously store a plurality of rows of image data corresponding to rows of pixels of image sensor pixel array 182. N row buffer 1102 can also simultaneously store rows of image data corresponding to rows of pixel of image sensor array. Image frame memory 1080 can simultaneously store image data defining a full frame of image data, which image data can correspond to a greater number of rows of image data than are buffered by N row buffer 1102 of image sensing and processing circuit 502.

At block 4014, terminal 1000 can subject at least one of the one or more frames to an attempt to decode for a decodable indicia. For attempting to decode a bar code symbol, e.g., a one dimensional bar code symbol, CPU 1060 can process image data of a frame corresponding to a line of pixel positions (e.g., a row, a column, or a diagonal set of pixel positions) to determine a spatial pattern of dark and light cells and can convert each light and dark cell pattern determined into a character or character string via table lookup. Where a decodable indicia representation is a 2D bar code symbology, a decode attempt can comprise the steps of locating a finder pattern using a feature detection algorithm, locating matrix lines intersecting the finder pattern according to a predetermined relationship with the finder pattern, determining a pattern of dark and light cells along the matrix lines, and converting each light pattern into a character or character string via table lookup.

At block 4018, terminal 1000 can output a decoded message. For output of a decoded message terminal 1000 can output the decoded message, e.g., to display 3024 and or a storage memory 1084 and/or an external device external from terminal 1000.

Reference will now be made to blocks 4020, 4024, 4028 active during a picture taking mode of operation. At block 4020, image sensing and processing circuit 502 where image sensor pixel array 182 includes a hybrid monochrome and color pixel array can output monochrome and color image data for one or more frames. In one example of block 4024, image sensing and processing circuit 502 can output one or more raw or processed frames of image data including both monochrome image data and color image data. For output of such frames, image sensing and processing circuit 502 can output the frames to CPU addressable image frame memory 1080. Image frame memory 1080 can simultaneously store a plurality of rows of image data corresponding to rows of pixels of image sensor pixel array 182. N row buffer 1102 can also simultaneously store rows of image data corresponding to rows of pixels of image sensor pixel array 182. Terminal 1000 can be operative so the image sensing and processing circuit 502 can output, and image frame memory 1080 can simultaneously store image data defining a full frame or windowed frame of image data, which image data can correspond to a greater number of rows of image data than are buffered by N row buffer 1102 of image sensing and processing circuit 502. There is set forth herein an apparatus comprising an image sensing and processing circuit having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions; the image sensing and processing circuit having an N row buffer for use in buffering image data corresponding to N rows of pixels of said image sensor pixel array; wherein the image sensing and processing circuit is operative to output a frame of image data having image data corresponding to K rows of pixels of said image sensor pixel array, wherein K>N, and wherein the image sensing and processing circuit is operative to determine monochrome pixel values corresponding to a plurality of the color pixel positions of the image sensor pixel array utilizing the N row buffer so the frame of image data output by the image sensing and processing circuit includes a plurality of monochrome pixel values that correspond to color pixel positions of the image sensor pixel array. In one embodiment, the N row buffer can be operative to buffer image data corresponding to less than ten percent (10%) of the rows of image sensor pixel array 182. Terminal 1000 and N row buffer 1102 can be operative so that image data corresponding to less then a complete row of pixels can be buffered by N row buffer 1102.

Figure 21:
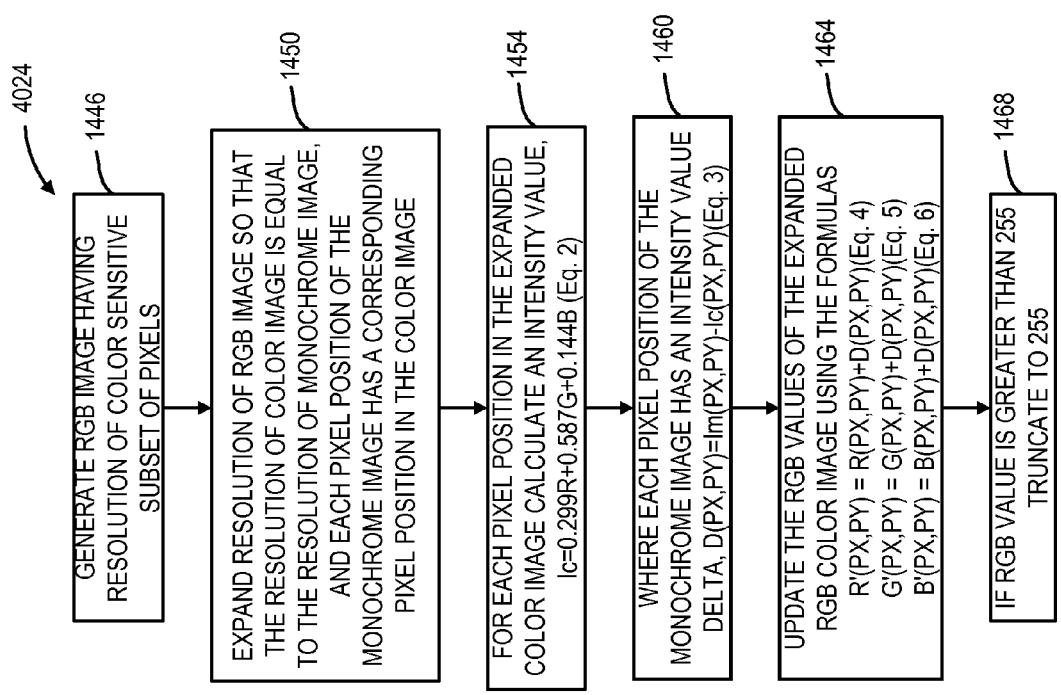
FIG. 21 is a flow diagram illustrating operation of an imaging terminal in one embodiment.

At block 4024, terminal 1000 can subject the monochrome and color image data to processing to determine at least one demosaicized frame. An example of block 4024 is described with reference to FIG. 21. Referring to the flow diagram of FIG. 21, terminal 1000 at block 1446 can generate an RGB image having a resolution of a color sensitive subset of pixels of image sensor pixel array 182. For such generation, terminal 1000 can first read a stored windowed frame output by selectively addressing of color pixels of image sensor pixel array 182. Alternatively, terminal 1000 can read color image data from a stored frame having monochrome and color image data. Further, for execution of block 4024, terminal 1000 can determine remaining color information for color image data corresponding to color pixel positions.

Referring to frame 5204 represented in FIG. 22, terminal 1000 can determine a red value for red pixel position $P_{32}$ simply by reading the color scale value of pixel position $P_{32}$. Terminal 1000 can determine a green value for red pixel $P_{32}$ by averaging the values of green pixel positions $P_{31}$, $P_{22}$, $P_{42}$, and $P_{33}$. Terminal 1000 may interpolate a blue value for red pixel position $P_{32}$ by averaging the values of blue pixel positions $P_{21}$, $P_{41}$, $P_{23}$, $P_{43}$. It will be seen that red, green, and blue values can be determined for each pixel position interpolating the pixel values as necessary. With increased processing speeds, it is possible to utilize dozens or more surrounding pixel values for interpolation of a red, green, or blue pixel for each pixel position. Referring again to the flow diagram of FIG. 21, at block 1446 terminal 1000 can generate an RGB image having resolution equal to the color sensitive subset of pixels of image sensor pixel array 182. With further reference to process 1440, terminal 1000 at block 1450 can expand the pixel count of the RGB image generated at block 1446 so that the pixel count of the color image is equal to the pixel count of a full frame monochrome image (a full frame monochrome image can be determined, e.g., by processing a stored monochrome and color frame for determining monochrome pixel values for color pixel positions, or by outputting from image sensing and processing circuit 502 a monochrome frame having monochrome pixel positions determined by processing performed by circuit 502 as set forth herein). When terminal 1000 executes block 1450, the monochrome gray scale image generated at block 1442 and the color image at that stage of the processing have equal numbers of pixels such that each pixel position e.g., pixel of the monochrome image has a corresponding pixel position in the color image. Where image sensor pixel array 182 has a period P=3, terminal 1000 at block 1450 can expand each pixel into a 3×3 pixel block. Where image sensor pixel array 182B includes the period of P=4, control circuit 552 at block 1450 expands each pixel into a 4×4 pixel block. At block 1454 terminal 1000 calculates an intensity value $I_C$ for each pixel position of the expanded color image. Terminal 1000 at block 1454 can calculate an intensity value for each pixel position of the expanded color image according to the formula $I_c=0.299R+0.587G+0.144B$ (Eq. 2).

Terminal 1000 at block 1460 can then calculate an intensity value delta, D, for each pixel position, (Px, Py) utilizing a monochrome image intensity value $I_m$ and an expanded image color intensity value, $I_c$, at each pixel position. Terminal 1000 at block 1460 may calculate an intensity value delta for each pixel position of the monochrome and expanded color image according to the formula $D(P_x, P_y)=I_m(P_x, P_y)-I_c(P_x, P_y)$ (Eq. 3)

At block 1464, terminal 1000 can update the RGB data set color scale values of the expanded RGB color image using the set of formulas $R'(P_x, P_y)=R(P_x, P_y)+D(P_x, P_y)$ (Eq. 4) $G'(P_x, P_y)=G(P_x, P_y)+D(P_x, P_y)$ (Eq. 5) $B'(P_x, P_y)=B(P_x, P_y)+D(P_x, P_y)$ (Eq. 6)

At block 1468, terminal 1000 can truncate RGB data set color scale values that are greater than 255 (where an 8 bit gray scale is used). After terminal 1000 truncates RGB values greater than 255, terminal 1000 can output one or more color frames as is set forth in the flow diagram of FIG. 19. In one embodiment, blocks 1446, 1450, 1454, 1460, 1464, 1468 can be executed by CPU 1060.

Referring again to the flow diagram of FIG. 19, terminal 1000 at block 4028 can output a color frame of image data. For output of a color frame of image data terminal 1000 can output a color frame, e.g., to display 3420 and or a storage memory 1084 and/or an external device external from terminal 1000. An output frame can be formatted in formatted image frame output e.g., JPEG, BMP, TIF, GIF. In one embodiment, terminal 1000 at block 4028 can output a succession of color frames. The succession of color frames can be formatted in a formatted video format, e.g., MPEG, MPG, MOV, RM, WVM, SWF.

Figure 23:
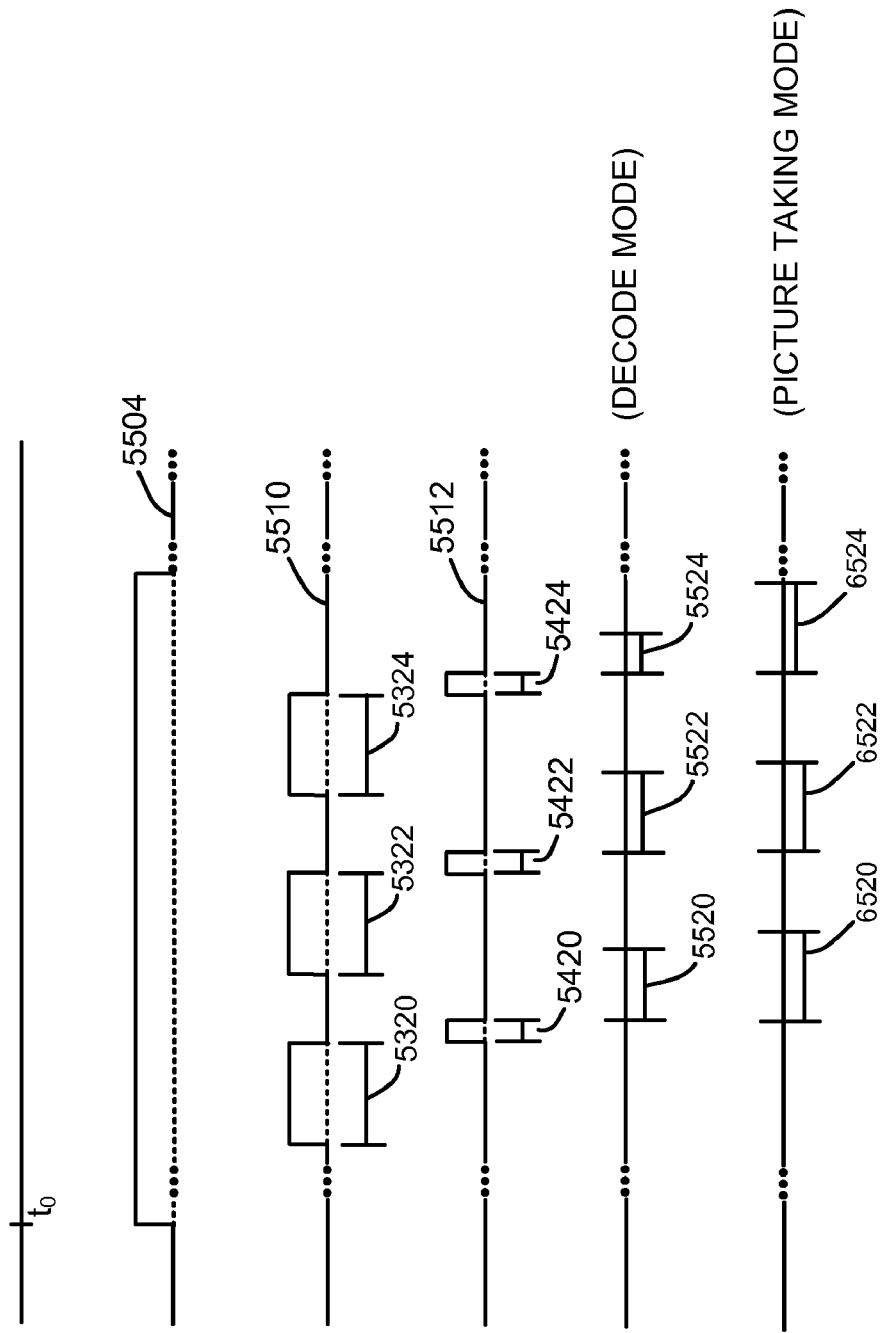
FIG. 23 is a timing diagram illustrating operation of an imaging terminal in one embodiment.

Referring to the timing diagram of FIG. 23, signal 5504 is a trigger signal which can be made active by actuation of trigger 1220, and which can be deactivated by releasing of trigger 1220. A trigger signal may also become inactive after a time out period or after a successful decode of a decodable indicia. Signal 5510 is an exposure signal. Logic high periods of signal 5510 define exposure periods 5320, 5322, and 5324. Signal 5512 is a read out signal. Logic high periods of signal 5512 define read out periods 5420, 5422, and 5424.

With further reference to the timing diagram of FIG. 23, an operator at time, $t_0$, can activate trigger signal 5504 (e.g., by actuation of trigger 1220). In response to trigger signal 5504 being activated, terminal 1000 can expose a succession of frames. During each exposure period 5320, 5322, 5324 a frame of image data can be exposed. Following each exposure period 5320, 5322, 5324 there can be readout periods 5420, 5422, 5424. During readout periods 5420, 5422, 5424, image sensing and processing circuit 502 can process image data in a manner set forth herein prior to output of image data for storage into CPU addressable image frame memory 1080. For example, image sensing and processing circuit 502 during periods 5420, 5422, 5424 can determine a monochrome pixel value corresponding to color pixel positions of an output frame output e.g., by execution of interpolation methods set forth with reference in FIG. 4.

Referring to processing periods 5520, 5522, 5524, the noted processing periods can represent processing periods active in a decode mode during which time CPU 1060 of terminal 1000 processes stored (e.g., buffered) frames representing a substrate that can bear decodable indicia. Such processing can include attempting to decode for decodable indicia represented in a frame. Referring to processing periods 6520, 6522, 6524, processing periods 6520, 6522, 6524 can represent processing periods of CPU 1060 active in a picture taking mode in which terminal 1000 utilizes monochrome image data and color image data for determining a demosaicized frame of image data. During processing periods 6520, 6522, 6524, CPU 1060 can execute block 4024 as described in connection with the flow diagram of FIG. 19.

Referring to processing periods 5520, 5522, 5524, a providing of image sensing and processing circuit 502 as set forth herein can significantly reduce a duration of periods 5520, 5522, 5524. Without image sensing and processing circuit 502 configured to determine monochrome pixel values corresponding to color pixel positions and where a decoding processing utilizes monochrome image data, a processing by CPU 1060 at periods 5520, 5522, 5524 can comprise determining monochrome pixel values corresponding to color pixel positions (where a frame being processed at periods 5520, 5522, 5524 include both monochrome and color image data). Processing time to determine monochrome pixel values corresponding to color pixel positions can be avoided for processing periods 5520, 5522, 5524 by providing of image sensing and processing circuit 502 as set forth herein, which can be capable of outputting a monochrome frame having monochrome pixel values corresponding to color pixel positions determined.

In a further aspect, terminal 1000 can have a plurality of operator activated operating modes.

A small sample of systems methods and apparatus that are described herein is as follows:

A1. A terminal comprising:

an image sensing and processing circuit having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions;

a lens assembly for use in focusing an image onto the image sensor pixel array; and a hand held housing, wherein the terminal is configured so that the hybrid monochrome and color image sensor pixel array is supported within the hand held housing;
a central processing unit (CPU);
an image frame memory addressable by the CPU;
wherein the image sensing and processing circuit is operative to output a CPU addressable frame of image data for storage into the CPU addressable image frame memory, the image sensing and processing circuit being operative to determine monochrome pixel values corresponding to a plurality of the color pixel positions of the image sensor pixel array so the CPU addressable frame of image data output by the image sensing and processing circuit for storage into the image frame memory includes a plurality of monochrome pixel values that correspond to color pixel positions of the image sensor pixel array.

A2. The terminal of A1, wherein the image sensing and processing circuit includes an N row buffer.

A3. The terminal of A1, wherein the image sensing and processing circuit includes an N row buffer operative to simultaneously store image data corresponding to N rows of pixels of the image sensor pixel array, wherein the image frame memory is operative to simultaneously store image data corresponding to M rows of pixels of the image sensor pixel array, wherein M>N.

A4. The terminal of A1, wherein the image sensing and processing circuit includes an N row buffer operative to simultaneously store image data corresponding to N rows of pixels of the image sensor pixel array, wherein the image frame memory is operative to simultaneously store image data corresponding to M rows of pixels of the image sensor pixel array, wherein M>N, and wherein the N row buffer is not addressable by the CPU.

A5. The terminal of A1, wherein the image sensing and processing circuit is operative so that the CPU addressable frame of image data includes monochrome image data only and is devoid of color image data.

A6. The terminal of A1, wherein the image sensing and processing circuit is operative to output a frame of first format and a frame of a second format, the first format being different from the second format.

A7. The terminal of A1, wherein the image sensing and processing circuit is operative to output a frame of first format and a frame of a second format, the first format being different from the second format, the first format being a monochrome frame format, the second format being a monochrome and color frame format.

A8. The terminal of A1, wherein the image sensing and processing circuit is operative to output a frame of first format and a frame of a second format, the first format being different from the second format, wherein the image sensing and processing circuit is operative to output a frame of the first format and a frame of the second format contemporaneously.

A9. The terminal of A1, wherein the image sensing and processing circuit is operative to output a frame of first format and a frame of a second format, the first format being different from the second format, the first format being a monochrome frame format, the second format being a monochrome and color frame format, wherein the image sensing and processing circuit is operative to output a frame of the first format and a frame of the second format contemporaneously.

A10. The terminal of A1, wherein the terminal is operative so that the CPU attempts to decode a decodable indicia utilizing the CPU addressable frame.

A11. The terminal of A1, wherein the image sensing and processing circuit includes an N row buffer incorporated on a common integrated circuit with said image sensor pixel array.

B1. An apparatus comprising:
an image sensing and processing circuit having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions;
the image sensing and processing circuit having an N row buffer for use in buffering image data corresponding to N rows of pixels of said image sensor pixel array;
wherein the image sensing and processing circuit is operative to output a frame of image data having image data corresponding to K rows of pixels of said image sensor pixel array, wherein K>N, and wherein the image sensing and processing circuit is operative to determine monochrome pixel values corresponding to a plurality of the color pixel positions of the image sensor pixel array utilizing the N row buffer so the frame of image data output by the image sensing and processing circuit includes a plurality of monochrome pixel values that correspond to color pixel positions of the image sensor pixel array.

B2. The apparatus of B1, wherein the N row buffer is operative to buffer image data corresponding to less than ten percent of the number of rows of the image sensor pixel array.

B3. The apparatus of B1, wherein the image sensing and processing circuit is operative to output a frame of first format and a frame of a second format, the first format being different from the second format.

B4. The apparatus of B1, wherein the image sensing and processing circuit is operative to output a frame of first format and a frame of a second format, the first format being different from the second format, the first format being a monochrome frame format, the second format being a monochrome and color frame format.

B5. The apparatus of B1, wherein the image sensing and processing circuit is operative to output a frame of first format and a frame of a second format, the first format being different from the second format, wherein the image sensing and processing circuit is operative to output a frame of the first format and a frame of the second format contemporaneously.

B6. The apparatus of B1, wherein the image sensing and processing circuit is operative to output a frame of first format and a frame of a second format, the first format being different from the second format, the first format being a monochrome frame format, the second format being a monochrome and color frame format, wherein the image sensing and processing circuit is operative to output a frame of the first format and a frame of the second format contemporaneously.

B7. The apparatus of B1, wherein the N row buffers incorporated on a common integrated circuit with the image sensor pixel array.

C1. A method comprising:
providing a hand held imaging terminal having an image sensor pixel array, a trigger, a microprocessor addressable image frame memory, and a microprocessor in communication with the microprocessor addressable image frame memory, the image sensor pixel array having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions;

actuating said trigger to initiate a trigger signal;

responsively to the initiation of the trigger signal, reading out image signals from a contiguous grouping of pixels of said image sensor array, the image signals comprising an analog intensity value for each pixel of the grouping, the analog intensity value for each pixel indicating light incident on the pixel;

digitizing analog intensity values read out into a pixel values to form a set of pixel values making up a frame of image data;

prior to output of said frame of image data for storage of said frame of image data into said image frame memory, processing said frame of image data for determination of monochrome pixel values corresponding to pixels of the second subset of pixels;

storing a processed frame image data into said image frame memory, the processed frame of image data having said determined monochrome pixel values corresponding to color pixel positions; and addressing pixel values of said processed frame of image data stored into said image frame memory.

C2. The method of C1, wherein said determining includes interpolating the monochrome pixel values utilizing monochrome pixel values corresponding to pixel positions about a color pixel position.

C3. The method of C1, wherein said determining includes simple averaging.

C4. The method of C1, wherein said determining includes correlation.

C5. The method of C1, wherein said addressing includes addressing said pixel values for attempting to decode for decodable indicia.

While the present invention has been described with reference to a number of specific embodiments, it will be understood that the true spirit and scope of the invention should be determined only with respect to claims that can be supported by the present specification. Further, while in numerous cases herein wherein systems and apparatuses and methods are described as having a certain number of elements it will be understood that such systems, apparatuses and methods can be practiced with fewer than the mentioned certain number of elements. Also, while a number of particular embodiments have been set forth, it will be understood that features and aspects that have been described with reference to each particular embodiment can be used with each remaining particularly set forth embodiment.

The invention claimed is:

1. A terminal comprising:
an image sensing and processing circuit having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions;

a lens assembly for use in focusing an image onto the image sensor pixel array; and a housing, wherein the terminal is configured so that the hybrid monochrome and color image sensor pixel array is supported within the hand held housing;

a central processing unit (CPU);

an image frame memory addressable by the CPU;

wherein the image sensing and processing circuit is operative to output a CPU addressable frame of image data for storage into the CPU addressable image frame memory, the image sensing and processing circuit being operative to determine monochrome pixel values corresponding to a plurality of the color pixel positions of the image sensor pixel array so the CPU addressable frame of image data output by the image sensing and processing circuit for storage into the image frame memory includes a plurality of monochrome pixel values that correspond to color pixel positions of the image sensor pixel array, wherein the image sensing and processing circuit includes an N row buffer operative to simultaneously store image data corresponding to N rows of pixels of the image sensor pixel array, wherein the image frame memory is operative to simultaneously store image data corresponding to M rows of pixels of the image sensor pixel array, wherein M>N, wherein the N row buffer is not addressable by the CPU, and wherein N and M are numerical values.

2. The terminal of claim 1, wherein the image sensing and processing circuit includes the N row buffer operative to simultaneously store image data corresponding to N rows of pixels of the image sensor pixel array, wherein the image frame memory is operative to simultaneously store image data corresponding to M rows of pixels of the image sensor pixel array, wherein M>N.

3. The terminal of claim 1, wherein the image sensing and processing circuit is operative so that the CPU addressable frame of image data includes monochrome image data only and is devoid of color image data.

4. The terminal of claim 1, wherein the image sensing and processing circuit is operative to output a frame of first format and a frame of a second format, the first format being different from the second format.

5. The terminal of claim 1, wherein the image sensing and processing circuit is operative to output a frame of first format and a frame of a second format, the first format being different from the second format, the first format being a monochrome frame format, the second format being a monochrome and color frame format.

6. The terminal of claim 1, wherein the image sensing and processing circuit is operative to output a frame of first format and a frame of a second format, the first format being different from the second format, wherein the image sensing and processing circuit is operative to output a frame of the first format and a frame of the second format contemporaneously.

7. The terminal of claim 1, wherein the terminal is operative so that the CPU attempts to decode a decodable indicia utilizing the CPU addressable frame.

8. The terminal of claim 1, wherein the image sensing and processing circuit includes the N row buffer incorporated on a common integrated circuit with said image sensor pixel array.

9. An apparatus comprising:
an image sensing and processing circuit having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions;

the image sensing and processing circuit having an N row buffer for use in buffering image data corresponding to N rows of pixels of said image sensor pixel array;

wherein the image sensing and processing circuit is operative to output a frame of image data having image data corresponding to K rows of pixels of said image sensor pixel array, wherein K>N, and wherein the image sensing and processing circuit is operative to determine monochrome pixel values corresponding to a plurality of the color pixel positions of the image sensor pixel array utilizing the N row buffer so the frame of image data output by the image sensing and processing circuit includes a plurality of monochrome pixel values that correspond to color pixel positions of the image sensor pixel array, and wherein N and K are numerical variables;

wherein the N row buffer is operative to buffer image data corresponding to less than ten percent of the number of rows of the image sensor pixel array.

10. The apparatus of claim 9, wherein the image sensing and processing circuit is operative to output a frame of first format and a frame of a second format, the first format being different from the second format.

11. The apparatus of claim 9, wherein the image sensing and processing circuit is operative to output a frame of first format and a frame of a second format, the first format being different from the second format, the first format being a monochrome frame format, the second format being a monochrome and color frame format.

12. The apparatus of claim 9, wherein the image sensing and processing circuit is operative to output a frame of first format and a frame of a second format, the first format being different from the second format, wherein the image sensing and processing circuit is operative to output a frame of the first format and a frame of the second format contemporaneously.

13. The apparatus of claim 9, wherein the image sensing and processing circuit is operative to output a frame of first format and a frame of a second format, the first format being different from the second format, the first format being a monochrome frame format, the second format being a monochrome and color frame format, wherein the image sensing and processing circuit is operative to output a frame of the first format and a frame of the second format contemporaneously.

14. The apparatus of claim 9, wherein the N row buffer is incorporated on a common integrated circuit with the image sensor pixel array.

15. A method comprising:

providing a hand held imaging terminal having an image sensor pixel array, a trigger, and a microprocessor the image sensor pixel array having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions;

actuating said trigger to initiate a trigger signal;

responsively to the initiation of the trigger signal, reading out image signals from a contiguous grouping of pixels of said image sensor array comprising the image signals comprising an analog intensity value for each pixel of the grouping, the analog intensity value for each pixel indicating light incident on the pixel;

digitizing analog intensity values read out to form a set of pixel values making up a frame of image data;

without prior storing of said frame of image data into an image frame memory of said hand held imaging terminal that is capable of simultaneously storing image data defining a full frame of image data, processing said frame of image data for determination of monochrome pixel values corresponding to pixels of the second subset of pixels;

storing a processed frame image data into said image frame memory, the processed frame of image data having said determined monochrome pixel values corresponding to color pixel positions; and addressing pixel values of said processed frame of image data stored into said image frame memory.

16. The method of claim 15, wherein said determining includes interpolating the monochrome pixel values utilizing monochrome pixel values corresponding to pixel positions about a color pixel position.

17. The method of claim 15, wherein said determining includes simple averaging.

18. The method of claim 15, wherein said determining includes correlation.

19. The method of claim 15, wherein said addressing includes addressing said pixel values for attempting to decode for decodable indicia.

20. A terminal comprising:

an image sensing and processing circuit having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions;

a lens assembly for use in focusing an image onto the image sensor pixel array; and a hand held housing, wherein the terminal is configured so that the hybrid monochrome and color image sensor pixel array is supported within the hand held housing;

a central processing unit (CPU);

an image frame memory addressable by the CPU;

wherein the image sensing and processing circuit is operative to output a CPU addressable frame of image data for storage into the CPU addressable image frame memory, the image sensing and processing circuit being operative to determine monochrome pixel values corresponding to a plurality of the color pixel positions of the image sensor pixel array so the CPU addressable frame of image data output by the image sensing and processing circuit for storage into the image frame memory includes a plurality of monochrome pixel values that correspond to color pixel positions of the image sensor pixel array;

wherein the image sensing and processing circuit includes an N row buffer operative to simultaneously store image data corresponding to N rows of pixels of the image sensor pixel array, wherein the image frame memory is operative to simultaneously store image data corresponding to M rows of pixels of the image sensor pixel array, wherein M>N, wherein the N row buffer is not addressable by the CPU, and wherein N and M are numerical variables.

21. The terminal of claim 20, wherein the image sensing and processing circuit includes an N row buffer operative to simultaneously store image data corresponding to N rows of pixels of the image sensor pixel array, wherein the image frame memory is operative to simultaneously store image data corresponding to M rows of pixels of the image sensor pixel array, wherein M>N, and wherein N is a numerical variable.

22. The terminal of claim 20, wherein the image sensing and processing circuit is operative so that the CPU addressable frame of image data includes monochrome image data only and is devoid of color image data.

23. The terminal of claim 20, wherein the image sensing and processing circuit is operative to output a frame of first format and a frame of a second format, the first format being different from the second format.

24. The terminal of claim 20, wherein the image sensing and processing circuit is operative to output a frame of first format and a frame of a second format, the first format being different from the second format, the first format being a monochrome frame format, the second format being a monochrome and color frame format.

25. The terminal of claim 20, wherein the image sensing and processing circuit is operative to output a frame of first format and a frame of a second format, the first format being different from the second format, the first format being a monochrome frame format, the second format being a monochrome and color frame format, wherein the image sensing and processing circuit is operative to output a frame of the first format and a frame of the second format contemporaneously.

26. The terminal of claim 20, wherein the terminal is operative so that the CPU attempts to decode a decodable indicia utilizing the CPU addressable frame.

27. The terminal of claim 20, wherein the image sensing and processing circuit includes an N row buffer incorporated on a common integrated circuit with said image sensor pixel array, and wherein N is a numerical variable.

28. An apparatus comprising:
an image sensing and processing circuit having a hybrid monochrome and color image sensor pixel array, the hybrid monochrome and color image sensor pixel array having a first subset of pixels and a second subset of pixels, the first subset of pixels being monochrome pixels devoid of color filter elements and a second subset of pixels being a color sensitive subset of pixels including color filter elements, the first subset of pixels having monochrome pixel positions, the second subset of pixels having color pixel positions;
the image sensing and processing circuit having an N row buffer for use in buffering image data corresponding to N rows of pixels of said image sensor pixel array;
wherein the image sensing and processing circuit is operative to output to an image frame memory a frame of image data having image data corresponding to K rows of pixels of said image sensor pixel array, wherein K>N, and wherein the image sensing and processing circuit is operative to determine monochrome pixel values corresponding to a plurality of the color pixel positions of the image sensor pixel array by performing calculations utilizing pixel values stored in the N row buffer so the frame of image data output by the image sensing and processing circuit includes a plurality of monochrome pixel values that correspond to color pixel positions of the image sensor pixel array, wherein the image frame memory is operative to simultaneously store image data corresponding to a greater number of rows of pixels of the image sensor array than are buffered by the N row buffer.

29. The apparatus of claim 28, wherein the N row buffers incorporated on a common integrated circuit with the image sensor pixel array.

\* \* \* \* \*